United States Patent
Chakraborty

[19]

[11] Patent Number: 6,124,715
[45] Date of Patent: Sep. 26, 2000

[54] TESTING OF LIVE CIRCUIT BOARDS

[75] Inventor: Tapan Jyoti Chakraborty, West Windsor, N.J.

[73] Assignee: Lucent Technologies, Inc., Murray Hill, N.J.

[21] Appl. No.: 09/059,012

[22] Filed: Apr. 13, 1998

[51] Int. Cl.[7] ................................................. G01R 31/02
[52] U.S. Cl. ......................... 324/537; 324/538; 324/763
[58] Field of Search ................................. 324/537, 538, 324/763

[56] References Cited

U.S. PATENT DOCUMENTS

| | | | |
|---|---|---|---|
| 5,124,660 | 6/1992 | Cilingiroglu | 324/538 |
| 5,399,975 | 3/1995 | Laing et al. | 324/537 |
| 5,486,753 | 1/1996 | Khazam et al. | 324/537 |
| 5,736,862 | 4/1998 | Hamblin | 324/537 |
| 5,818,251 | 10/1998 | Intrater | 324/765 |

*Primary Examiner*—Glenn W. Brown
*Attorney, Agent, or Firm*—Henry I. Schanzer, Esq

[57] ABSTRACT

Apparatus and method for testing the components and interconnections of a circuit board while the circuit board is, normally, operatively connected in a system. The circuit board contains a plurality of integrated circuits with at least one of the integrated circuits including interface circuitry for interfacing the circuitry on the circuit board to the rest of the system. The circuit board includes testing circuitry for: (a) selectively testing the circuits contained on the circuit board, other than its interface circuits; and (b) selectively testing the interface circuits and their interconnections. The method of the invention includes placing the interface circuitry in a first state for isolating the circuitry on the circuit board from the rest of the system and testing the circuitry on the circuit board, other than the interface circuitry; and placing the interface circuitry in a second state and testing the interface circuitry and its interconnections.

13 Claims, 3 Drawing Sheets

TESTING OF LIVE CIRCUIT BOARDS

BACKGROUND OF THE INVENTION

This invention relates to the testing of fully populated circuit boards while connected in an operating (live) system and, in particular, to apparatus and methods for testing these circuit boards so as to reduce the down time of the system.

The circuit boards to be tested in accordance with the invention are normally fully populated with circuit components (e.g., integrated circuits and the like) which were already tested for operability and functionality before being mounted on the circuit boards. Although the individual components mounted on a circuit board of interest were previously tested and found to be fully operational, it is possible that, in the course of mounting the components on a board, certain components and/or interconnections may become, or be rendered, defective (e.g., they may be shorted or opened). It is also possible that, as a function of time and under temperature or other operative stresses, certain components and/or connections may become defective and/or non-functional. This is problematic in applications where a very high degree of reliability is desired and/or necessary. Therefore, in many electrical systems, where a high degree of reliable operation is essential, it is necessary to continuously test the circuit boards to ensure their operability. This is also the case where the system includes a spare (duplicate or redundant) board for each circuit board. That is, the circuit boards and their duplicate circuit boards are required to be constantly tested for operability.

A problem in testing circuit boards while they are connected in an operating system (live or on-line) is that the operation of the system has to be interrupted. This is highly undesirable. Accordingly, it is an object of this invention to reduce the down time of the system when the circuit boards are being tested.

SUMMARY OF THE INVENTION

The invention resides, in part, in circuit boards which are especially designed for enabling a large portion of the circuitry on each circuit board to be tested while the circuit board is connected in circuit in an operating (live) system. The remainder of the circuitry on each circuit board, which represents a small portion of the circuitry on the circuit board, can be tested while the operation of the system is interrupted for a brief period of time.

A circuit board embodying the invention includes a plurality of integrated circuits (ICs) disposed on a circuit board. Selected ones of the ICs include interface circuits for coupling selected input and output nodes of their respective ICs to an output connector and via the output connector to a system back plane. The circuit board includes circuitry for selectively placing the interface circuits in a first state for decoupling the selected ICs from the system back plane and for then testing the integrated circuits contained on the circuit board, other than the interface circuits. The circuit board also includes circuitry for selectively enabling the interface circuits for testing them and their interconnections.

The invention also resides in a method for testing a circuit board while it is connected in an operating system such that the system down time is a small portion of the total required test time.

An electronic system embodying the invention includes a circuit board containing a plurality of integrated circuits (ICs) with at least one of these ICs including interface circuitry for interfacing the circuitry on the circuit board to the electronic system. A method for testing the circuit board includes: (a) the step of placing the interface circuitry in a first state for isolating the circuitry on the circuit board from the electronic system, and for testing the circuitry on the circuit board, other than the interface circuitry; and (b) the step of placing the interface circuitry in a second state for enabling the testing of the interface circuitry and its interconnections. During the step of testing the interface circuitry the operation of the system is interrupted. However, the amount of time required to test the interface circuitry is small compared to the time required to test the rest of the circuitry on the circuit board. Hence, the system down time is significantly reduced.

In a system embodying the invention, first and second duplicate circuit boards are connected to the back plane of a system so that, at any one time, either one of the first and second circuit boards can be connected in circuit and can then be operated in, and with, the system. Each circuit board includes a plurality of interconnected integrated circuits (ICs), with selected ones of the ICs having interface circuits for coupling selected input/output nodes of their ICs to the back plane of the system. While the first circuit board is operatively connected in circuit with the system the second circuit board may be tested in two stages (or phases). In one of the two stages, the interface circuitry of the second circuit board is placed in a first state to decouple the second circuit board from the system and for preventing it from interfering with the system operation. Concurrently, during this one stage, test signals are supplied to the second circuit board for testing the circuitry on the second circuit board (other than the interface circuitry). During this one stage of the testing, which requires most of the testing time (e.g., 80% of the testing time), the system is fully operative with the first circuit board connected in circuit with the system. In the second stage, the interface circuitry of the second circuit board is tested and the operation of the system which relies on the operability of the first or the second circuit board needs to be interrupted. However this portion of the testing time is only a small portion of the testing time (e.g., 20% of the entire testing time).

Thus, the apparatus and method of the invention enable the circuit boards of a highly reliable and complex system to be tested with sharply reduced system down time.

BRIEF DESCRIPTION OF THE DRAWINGS

In the accompanying drawings like reference characters denote like components.

DETAILED DESCRIPTION OF THE INVENTION

To better understand the description to follow, it should be appreciated that Applicant's invention pertains to systems and applications where a high degree of reliability is required. These systems and applications may be very complex and may include a large number of circuit boards, with each circuit board containing a large number of integrated circuits (ICs) and other electronic components. The ICs contained on the circuit boards may be used to perform digital functions, analog functions and/or a combination of digital and analog functions.

It should also be appreciated that in these highly reliable systems and applications, duplicate ("spare" or "redundant") circuit boards are normally provided for many (if not all) of the circuit boards. Thus, systems of interest may include a large number of duplicate or "twin" boards. For example, in most telecommunication switching systems redundant circuit boards are used to ensure that the systems function in a highly reliable manner. In a telecommunication switch, such as AT&T's Electronic Switching System (5ESS), which may contain many (e.g., tens or more) different circuit boards, every circuit board is duplicated for back up purposes. During normal operation of the switch while one board of each type is operational, the other board of each type is periodically and thoroughly tested as part of a system maintenance function to ensure its correctness.

Figure 1:
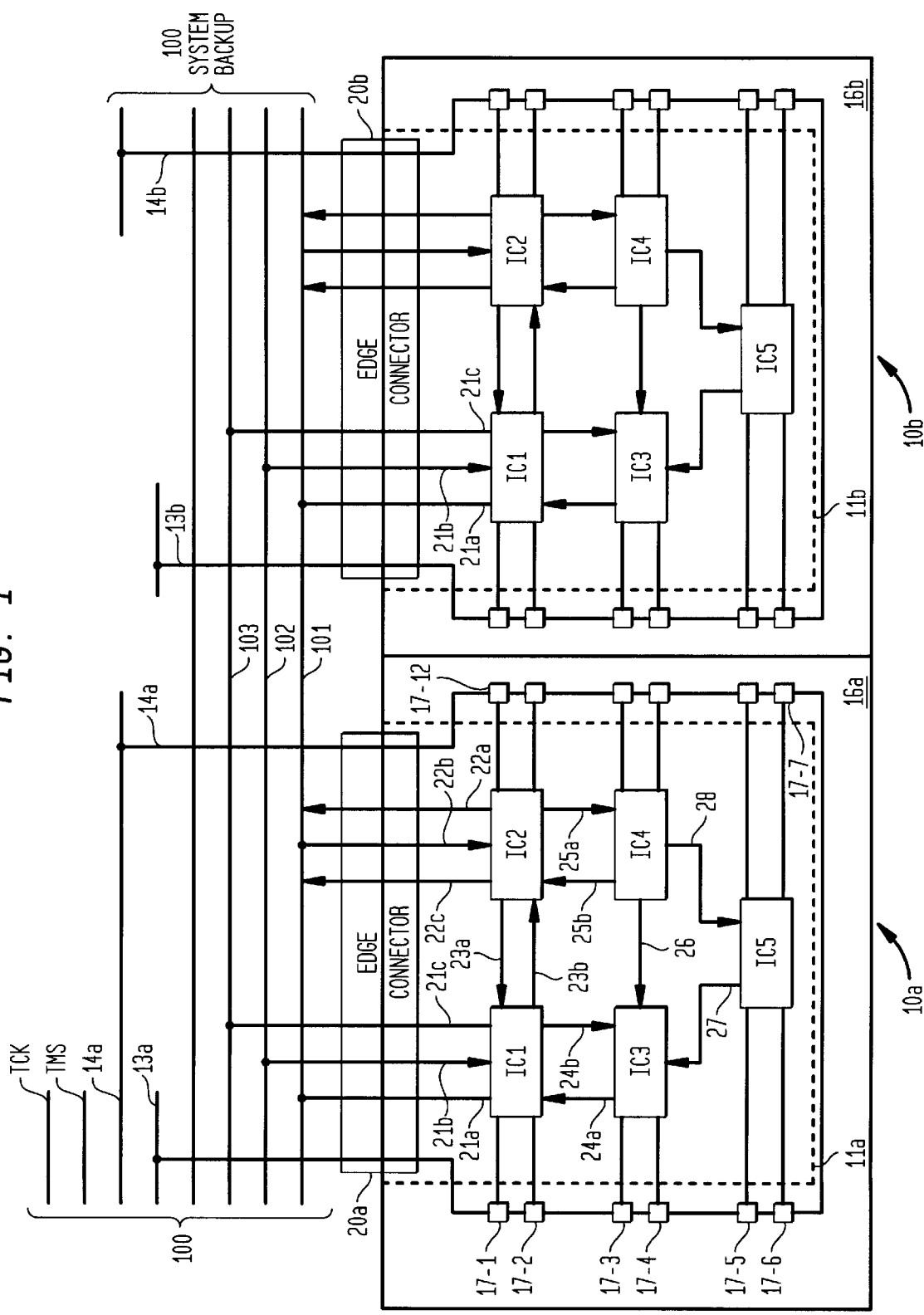
FIG. 1 is a simplified block diagram representation of two circuit boards interconnected to the back plane of an electronic system in accordance with the invention.

Referring to FIG. 1, there is shown two duplicate circuit boards (10a, 10b), which may be part of a system which may contain many duplicate circuit boards, where the circuit boards may be used to perform numerous functions. In FIG. 1, for purpose of illustration, each circuit board (10a, 10b) includes five integrated circuits (IC1 through IC5) which are interconnected to produce a desired function or functions. Printed circuit boards 10a and 10b are intended to be the duplicate of each other (i.e., the same). Therefore, only board 10a, will be discussed in detail.

To aid in the explanation and understanding of the invention only some basic and typical interconnections are provided. Thus, IC1 is shown connected via connections 21a, 21b and 21c to an edge connector 20a and the edge connector 20a couples these connections to the system back plane 100. Similarly, connector IC2 is connected via connections 22a, 22b and 22c to edge connector 20a and via connector 20a, to the system back plane 100. IC1 and IC2 are interconnected via connections 23a, 23b. IC1 is connected to IC3 via connections 24a, 24b. IC2 is connected to IC4 via connections 25a, 25b. IC3 and IC4 are interconnected via connection 26. IC3 is connected to IC5 via connection 27. IC5 and IC4 are interconnected via connection 28.

Figure 2:
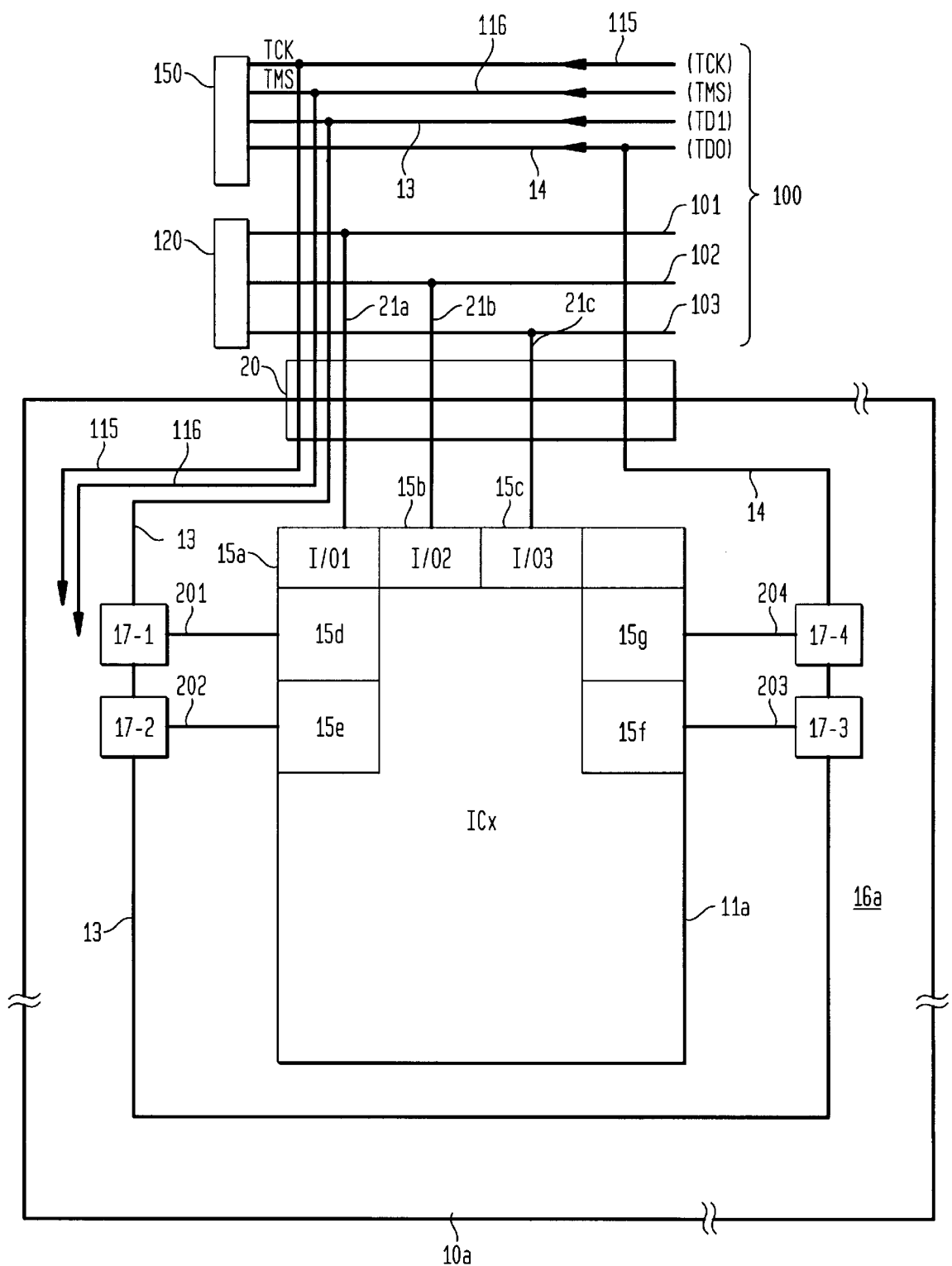
FIG. 2 is a detailed block diagram of an integrated circuit (IC) mounted on a circuit board with boundary scan circuitry suitable for practicing the invention.

It is important to note that each one of IC1 and IC2 includes interface circuitry coupling its inputs and outputs to the connector 20a and via connector 20a to the rest of the system. The interface circuitry (15a, 15b, 15c) is shown illustratively for an integrated circuit ICx in FIG. 2; where ICx represents either IC1 or IC2 of FIG. 1. Referring to FIG. 2, ICx includes input/output (I/O) circuitry 15a, 15b, 15c for interfacing between the circuitry contained on ICx and the connector 20, which connector provides connections to the system backplane 100 and to the rest of the system (not shown).

Figure 3:
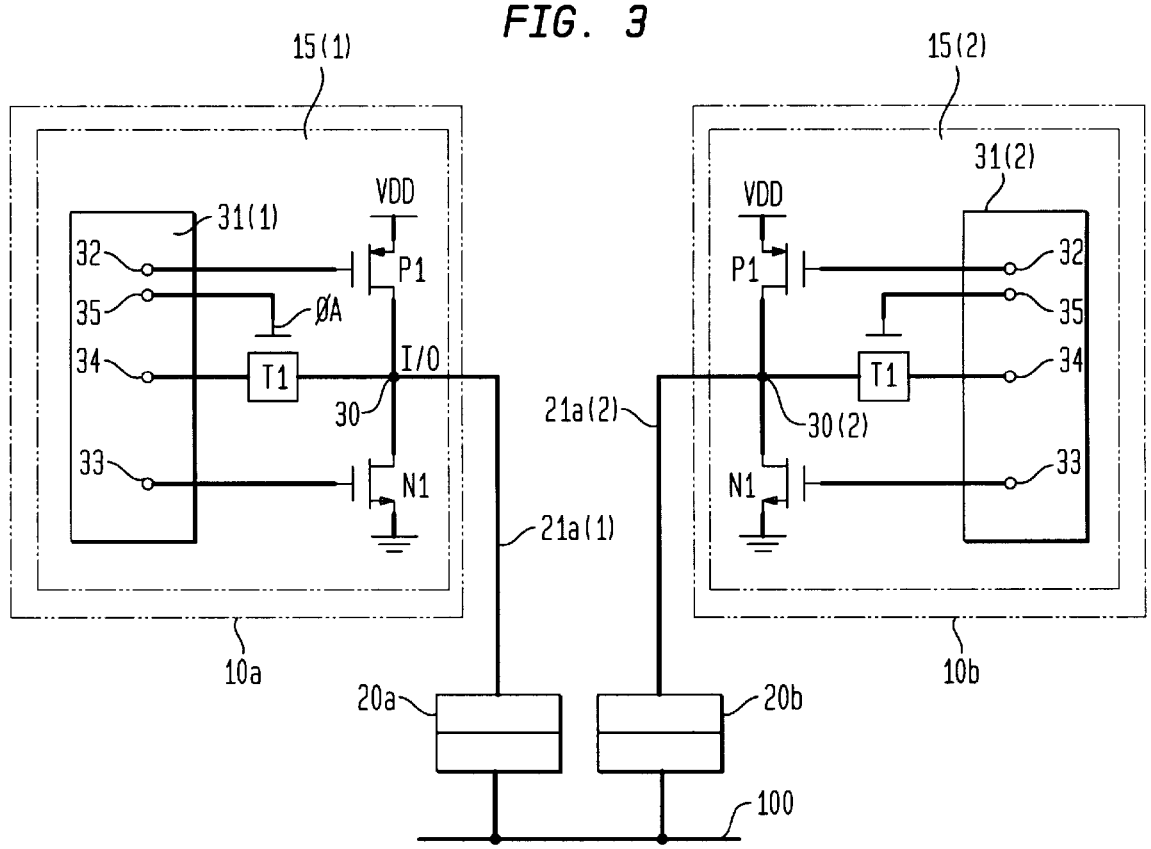
FIG. 3 is a semi schematic semi block diagram of tri-state circuitry suitable for use as interface circuitry on circuit boards in systems embodying the invention.

A tri-state interface or I/O circuit suitable for use in circuits embodying the invention is shown in FIG. 3. Each I/O stage (15) includes: a) an I/O node 30; b) a P type pull-up transistor (e.g., P1) connected between I/O node 30 and a positive source of voltage (e.g., $V_{DD}$) to selectively supply a high voltage to the I/O node; and c) an N type pull-down transistor (e.g., N1) connected between the I/O node 30 and ground to selectively supply a "low" to I/O node 30. The gate electrodes of transistors P1 and N1 are connected via separate lines to internal nodes 32 and 33, respectively, in a circuit 31 which, in response to signals produced in its associated IC (or a control circuit), controls the turn on and turn-off of these transistors and, thereby, the application of a high or low to I/O node 30.

In FIG. 3, a selectively enabled transmission gate (e.g., T1) is shown connected between the I/O node 30 and an internal node 34 of circuit 31. The transmission gate (T1) is controlled by a signal φA. When φA is high, the transmission gate is enabled (i.e., presents a low impedance conduction path between I/O node 30 and input node 34. When φA is low, the transmission gate T1 is disabled and there is essentially an open circuit between I/O node 30 and input node 34.

Each I/O stage 15 is a tri-state circuit. When P1 is on (and N1 is off) the I/O node 30 is clamped to $V_{DD}$; when N1 is on (and P1 is off) the I/O node 30 is clamped low. When transistors P1 and N1 are both turned off, the output driver circuit is placed in what may be termed a high impedance (high-Z) mode. That is, the impedance between the output node 30 and $V_{DD}$ or ground is very high. However, the transmission gate T1 may be independently activated (when P1 and N1 are off) so that a signal may be applied from the system back plane 100 via the transmission gate T1 to node 34 of circuit 31 and then to the rest of the IC.

The tri-state circuits permit the testing of the circuit boards in the following sense. Selected tri-state circuits interfacing between the circuit board and the back plane 100 may be placed in their high-Z state (their P-type and N-type transistors are turned off). Then, the transmission gates T1 of the selected tri-state circuits are enabled and signals may be supplied to, or received from, internal nodes such as 34 shown in FIG. 3.

Referring back to FIG. 1, note that the circuit boards of FIG. 1 also include a framework of additional circuitry (boundary-scan), generally shown in sections 16a, 16b, to ensure that built-in test facilities can be used and/or that pre-existing test patterns can be applied to convey test data to or from the boundaries of individual components (e.g., ICs) so that they can be tested as if they were freestanding. The inclusion of a boundary-scan architecture enables a test framework to be formed on assembled printed circuit boards.

The boundary-scan technique shown in FIG. 1 includes a multi-stage shift register section (16a, 16b) on each circuit board (10a and 10b) with a shift-register stage (17-i) (contained in a boundary-scan cell) adjacent to each component pin of the various ICs on the circuit boards so that signals at component boundaries can be controlled and observed using scan testing principles. The boundary-scan cells (17-i) for the pins of a component are interconnected so as to form a shift register chain (16) around the border of each circuit board. As further detailed in FIG. 2, test data input signals (TDI) are supplied to the shift register chain 16 by means of a serial input line 13. Test data output signals (TDO) are obtained from the shift register chain 16 by means of a serial output line 14. A test clock signal (TCK) is supplied to the shift register stages of the chain via a line 115 in order to shift data into and out of the shift register chain. In addition, test mode sequence (TMS) signals are supplied to the shift register stages via a line 116 to control various test modes.

As shown in FIG. 2, the signals TDI, TCK and TMS may be generated by a test processor 150 capable of receiving and analyzing the output signals TDO. Test processor 150 may include circuitry of the type found in the Lucent Boundary Scan Master (BSM) or in the Texas Instrument Test Bus Controller (TBC). The test processor, or generator, 150 supplies the TDI signal on line 13, the TCK signal on line 115, the TMS signal on line 116 and receives the TDO signals on line 14. System signals, other than test signals, are coupled between the electronic system generically represented by block 120 and the circuit boards via back plane 100 conductors (e.g., 101, 102, 103).

On each circuit board containing several integrated circuits, as shown in FIG. 1, the boundary-scan cells, to test the individual components of the circuit board, are connected in series to form a single path through the complete circuit board. In FIG. 1, a serial data input (13a) supplies data signals to the first stage (17-1) and a serial data output line (14a) is connected to the last stage (17-12) of the shift register (16a). Alternatively, a board could contain several independent boundary-scan paths.

By way of example, the testing of circuit board 10a may be conducted as follows.

1. Circuit boards 10a and 10b are coupled via their respective connectors (20a, 20b) to the system backplane 100. Assume that an electronic switching system 120 is functioning (live) and making use of the circuitry on circuit board 10b in its operation. While the system including circuit board 10b is operational circuit board 10a is to undergo testing, as described below.

2. One phase of testing circuit board 10a includes placing the interface circuits (e.g., 15a, 15b and 15c in FIG. 2) of circuit board 10a in a high-Z state. The high-Z state is set up by turning off the pull-up and pull down transistors (P1 and N1) in the I/O stages 15a, 15b, and 15c (see FIGS. 2 and 3). The signals for effectuating the high-Z state may be generated from the system 120 or by use of the boundary scan circuitry or by a combination of the two and any other means developed to test the system. If boundary scan technology is used, then specific test instructions may be used to implement the High-Z mode. When the interface circuits (15a, 15b, 15c) on circuit board 10a arc place in the high-Z state, the circuitry on circuit board 10a can not affect the operation of the system.

3. After the interface circuitry of circuit board 10a is placed in its high-Z mode, test signals can be supplied to the rest of the circuitry on circuit board 10a to test the rest of the circuit board's circuitry and its interconnections. Test signals can be supplied to the remainder of the circuit board 10a from: (a) the system 120 via transmission gates T1 in the interface circuits; or (b) the test processor 150 via the boundary scan circuitry; or (c) a combination of the system 120 and the processor 150. When using the boundary scan technique, test signals generated by the processor 150 are applied to input line 13(a), which test signals are then coupled via the shift register 16a and the various shift register stages (17-i) to the various component pins of the circuit board 10a, as shown in FIGS. 1 and 2. As noted above, in boundary scan technology, four signals (TDI, TMS, TCK, and TDO) are used to route test signals to a predetermined number (some or all) of ICs on a circuit board which has boundary scan structure. These signals may be generated from a boundary scan controller controlled by the system or any suitable arrangement. [A more detailed description of the boundary scan technique may be found in the IEE boundary scan standard 1149.1–1990, which is incorporated herein by reference.] During the testing of a circuit board using the scan boundary technology, test signals are applied to input line 13 which controls shift register stage 17-1. In FIG. 2, stage 17-1 is shown coupled via line 201 to a circuit port 15d of ICx. Circuit port 15d may be a simple terminal, a selectively enabled transmission gate, or a tri-state I/O circuit of the type shown in FIG. 3. In any event, regardless of its structure, the signal on line 201 is coupled via circuit port 15d to the circuitry contained on ICx. The response of the circuitry contained on ICx to a predetermined input at circuit port 15d is known. Therefore, resulting signals produced at output terminal 14 may be used to verify the operability of the circuitry and the validity of the interconnections.

Also, in FIG. 2, a stage 17-2 is shown coupled via a line 202 to a circuit port 15e of ICx, a stage 17-3 is shown coupled via a line 203 to a circuit port 15f of ICx and a stage 17-4 is shown coupled via a line 204 to a circuit port 15g of ICx. Test signals supplied via line 13 are propagated along the stages (17-i) of shift register 16a by means of signals TCK and TMS on lines 115 and 116 to exercise all the components of ICx, except for the interface circuits (e.g., 15a, 15b and 15c) coupling the circuit board to the system back plane 100. The components of ICx subjected to testing will produce an indication on output line 14 of the operability and viability of the components of the circuit board, except for the status of the interface circuitry. If the test signals applied to circuit board 10a are applied solely via line 13, the transmission gates T1 in I/O stages 15a, 15b and 15c may also be kept turned off, whereby the system 120 will also not have any effect on the operation of the circuit board. In which case, during this testing cycle (phase or stage) the components of circuit board 10a do not interfere with the operation of the system, and vice-versa. In fact, circuit board 10a may be considered to be electrically isolated from the system.

However, as noted above, the system 120 may be used to supply test signals to circuits contained on circuit board 10a (so long as the output drivers are kept turned-off), by turning on the transmission gates T1 in the interface circuit and supplying test signals via these enabled transmission gates.

4. Although most of the circuits on circuit board 10a and their interconnection have been tested by the steps just described, the operability and viability of the interface circuitry has not yet been determined. To complete the testing of circuit board 10a, the interface circuits (e.g., 15a, 15b, 15c) must be enabled. This requires that the output driving transistors (P1 and N1 in FIG. 3) must be turned on and off. However, note that the interface circuit outputs of circuit board 10a drive the same I/O nodes and lines (e.g., 101, 102 and 103 in FIG. 1) on the system back plane as the interface circuit outputs of circuit board 10b. Thus to test the interface circuits on circuit board 10a, the operation of circuit 10b must be interrupted since circuit boards 10a and 10b share common lines (101, 102 and 103) in the back plane. Hence, if either one of these two boards (10a, 10b) is needed for proper operation of the system, the operation of the system also must be interrupted.

5. After the operation of circuit board 10b in the system is interrupted, test pattern may be supplied to various inputs and ICs of circuit board 10a (as shown for ICx in FIG. 2). The testing of the interface circuits can be conducted under the control of processor 150, system 120 or a combination of both. Since the test signals are known, the resultant outputs at each output node of the interface circuits indicate whether the interface circuits and their interconnections are operative. As already noted, during the testing of the interface circuits of board 10a, the interface circuits of circuit board 10b must be set to their high-Z state since the outputs of circuit board 10a drive the same I/O nodes on the system back plane as the outputs of circuit board 10b. Hence, to perform this portion of the testing, the normal operation of the system must be interrupted to enable the testing of the interface circuit on circuit board 10a.

It is again noted, that, in accordance with the method and apparatus of the invention, a large portion of the testing (e.g., 80%) requiring most of the testing time can be conducted while the interface circuitry is in its high-Z state and the system is fully operational. Only a small portion of the testing (e.g., 20%) requiring a small portion of the testing time needed to test out the interface circuitry located on each circuit board requires interruption of the operation of the system. Thus, a large portion of the testing time does not require the system to be rendered inoperative. Except for the output drivers and their associated circuitry, the remainder of the circuitry can be tested and its operability determined. The importance of this point is that most of the circuit board 10a can be tested while board 10b is operating in the system and the system is fully functional.

It should be noted that the sequence of testing the circuitry on the circuit boards can be other than that described above. That is, the interface circuits and their interconnections can first be tested (and the operation of the system interrupted) and then the interface circuitry can be disabled for enabling the testing of the remainder of the circuitry on the circuit board, while the system is fully operational.

It should also be noted that the output line 14 of one board can be connected to and function as the input line to the other board. Alternatively, the input lines can be connected in parallel, with the various output lines 14 being separately sensed or multiplexed.

What is claimed is:

1. A method for testing the components and interconnections of a circuit board while the circuit board is, normally, operatively connected to a system, where the circuit board contains a plurality of integrated circuits with at least one of the integrated circuits including interface circuitry for interfacing the circuitry on the circuit board to the rest of the system, comprising the steps of:

placing the interface circuitry in a first state for isolating the circuitry on the circuit board from the rest of the system and testing the circuitry on the circuit board, other than the interface circuitry; and placing the interface circuitry in a second state and testing the interface circuitry and its interconnections.

2. A method as claimed in claim 1 wherein the step of placing the interface circuitry in a second state also includes the step of interrupting the operation of the system.

3. A method as claimed in claim 2 wherein the interface circuitry includes tri-state circuits which are placed in a high impedance state in said first state.

4. A method as claimed in claim 1 wherein the circuit board includes test cells disposed about the circuit board, with the test cells being coupled to selected ones of the integrated circuits; and wherein the testing of the circuitry on the circuit board includes the step of supplying test signals to these test cells for application to selected integrated circuits.

5. A circuit board comprising:

a plurality of integrated circuits (ICs) disposed on said circuit board;

interface circuits for coupling selected input and output nodes of selected ones of said ICs on said circuit board to a connector; and testing circuitry for selectively testing the integrated circuits contained on said circuit board independently of said interface circuits and for selectively testing the interface circuits.

6. A circuit board as claimed in claim 5 wherein the testing circuitry includes test cells disposed about the circuit board with the test cells being coupled to selected nodes of selected ICs on the circuit board; and wherein the testing circuitry further includes control lines coupled to the test cells for supplying test signals to selected ones of said selected nodes.

7. A circuit board as claimed in claim 6, wherein the test cells are disposed about the circuit board so as to form a serial shift register.

8. A circuit board as claimed in claim 6, wherein the interface circuits are tri-state circuits, each tri-state circuit having an output node which can be set to a high impedance condition.

9. A circuit board as claimed in claim 5 wherein the interface circuits are included within selected integrated circuits.

10. A method for testing a circuit board containing a plurality of interconnected components, when the circuit board is operatively connected in a system, comprising the steps of:

placing certain components of the circuit board in a high-impedance state and testing the remaining components on the circuit board and their interconnections; and testing the certain components of the circuit board and interrupting the operation of the system during the testing of the certain components.

11. In an electronic system including first and second duplicate circuit boards, each circuit board containing a plurality of integrated circuits, at least one of these integrated circuits including interface circuitry for interfacing the circuitry on the circuit board to the electronic system, a method for testing the circuit boards while the system is normally operational, comprising the steps of:

operating the first circuit board in the system and placing the interface circuitry of the second circuit board in a first state for isolating the circuitry on the second circuit board from the electronic system and testing the circuitry on the second circuit board, other than its interface circuitry; and placing the interface circuitry of the second circuit board in a second state and testing the interface circuitry and its interconnections.

12. In an electronic system as claimed in claim 11 wherein the step of placing the interface circuitry of the second circuit board in a second state also includes the step of interrupting the operation of the system requiring the operability of either the first or the second circuit boards.

13. An electronic system comprising:

first and second duplicate circuit boards; each circuit board including a plurality of integrated circuits with selected integrated circuits including a multiplicity of interface circuits for coupling selected input and output nodes of selected ones of said integrated circuits to a connector for interconnecting the circuit board to the rest of the electronic system; and testing circuitry on each circuit board for: (a) selectively testing the circuits contained on its circuit board, other than its interface circuits; and (b) selectively testing the interface circuits.

* * * * *